(12) United States Patent
Liu

(10) Patent No.: US 6,838,759 B1
(45) Date of Patent: Jan. 4, 2005

(54) SMALL MEMORY CARD

(75) Inventor: Pierre Liu, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 10/705,801

(22) Filed: Nov. 10, 2003

(51) Int. Cl.[7] .............................................. H01L 23/02
(52) U.S. Cl. ..................... 257/679; 257/787; 257/783; 235/380; 361/796; 361/797
(58) Field of Search ................. 257/679, 783, 257/787; 235/380; 361/796, 797

(56) References Cited

U.S. PATENT DOCUMENTS

| | | | | |
|---|---|---|---|---|
| 5,352,875 A | * | 10/1994 | Enomoto | 235/380 |
| 6,011,858 A | * | 1/2000 | Stock et al. | 382/115 |
| 6,639,309 B2 | * | 10/2003 | Wallace | 257/678 |
| 6,764,346 B2 | * | 7/2004 | Fujita et al. | 439/638 |
| 2004/0009708 A1 | * | 1/2004 | Gochnour et al. | 439/638 |

* cited by examiner

Primary Examiner—Jasmine Clark
(74) Attorney, Agent, or Firm—Pro-Techtor International Services

(57) ABSTRACT

A small memory card with a monitor includes a substrate, at least one memory chip, at least one monitor, and a glue layer. The substrate is formed with an upper surface and a lower surface, the upper surface is formed with a plurality of connected points and a plurality of golden fingers electrically connected to the plurality of connected points. The substrate is used to arrange in an electric device, the memory chip, which is mounted on the upper surface of the substrate, electrically connected to the plurality of connected points of the upper surface. The monitor is mounted on the side of the upper surface of the substrate, so that the aspect and location of the plurality of the golden fingers may be recognized. The glue layer is encapsulated and protected the memory chip. Thus, the display of the monitor may be recognized the operating aspect.

7 Claims, 3 Drawing Sheets

SMALL MEMORY CARD

BACKGROUND OF THE INVENTION

1. Field of the Invention

The present invention relates to a small memory card with a monitor, and more particular to a small memory card could be recognized the operating side easily.

2. Description of the Related Art

Referring to FIG. 1 showing the up-side view of a prior memory card, which includes a substrate 10 and at least one memory chip 16, the substrate 10 is formed with a plurality of golden gingers 12, as insert the substrate 10 into the electric device, the plurality of golden fingers 12 may be electrically connected to the electric device, and the substrate 10 is formed with a gap 14, which is the inserting aspect, the memory chip 16, which is mounted on the substrate 10, electrically connected to a plurality of golden fingers 12.

But, the above-mention small memory card need to be cut and is formed with a gap 14, the manufacturing process is inconvenient and the manufacturing cost will increase, moreover, if the substrate 10 was cut imperfectly, the substrate 10 is unusable.

SUMMARY OF THE INVENTION

The object of the present invention is to provide a small memory card with a monitor may be recognized the operating side easily.

To achieve the above-mentioned object, the present invention includes a substrate, at least one memory chip, at least one monitor, and a glue layer, the substrate is formed with an upper surface and a lower surface, the upper surface is formed with a plurality of connected points and a plurality of golden fingers, and the substrate is used to set in the electric device, so that the plurality of golden fingers may be electrically connected to the electric device, the memory chip, which is mounted on the upper surface of the substrate, electrically connected to a plurality of connected points of the upper surface of the substrate, the monitor that is mounted on the side of the upper surface of the substrate, is represent the aspect and location of the golden fingers, the glue layer encapsulated and protected the memory chip.

According to one aspect of the present invention, the memory card may be recognized the aspect of the golden fingers, so the small memory card may be operated conveniently.

DETAILED DESCRIPTION OF THE INVENTION

Figure 1:
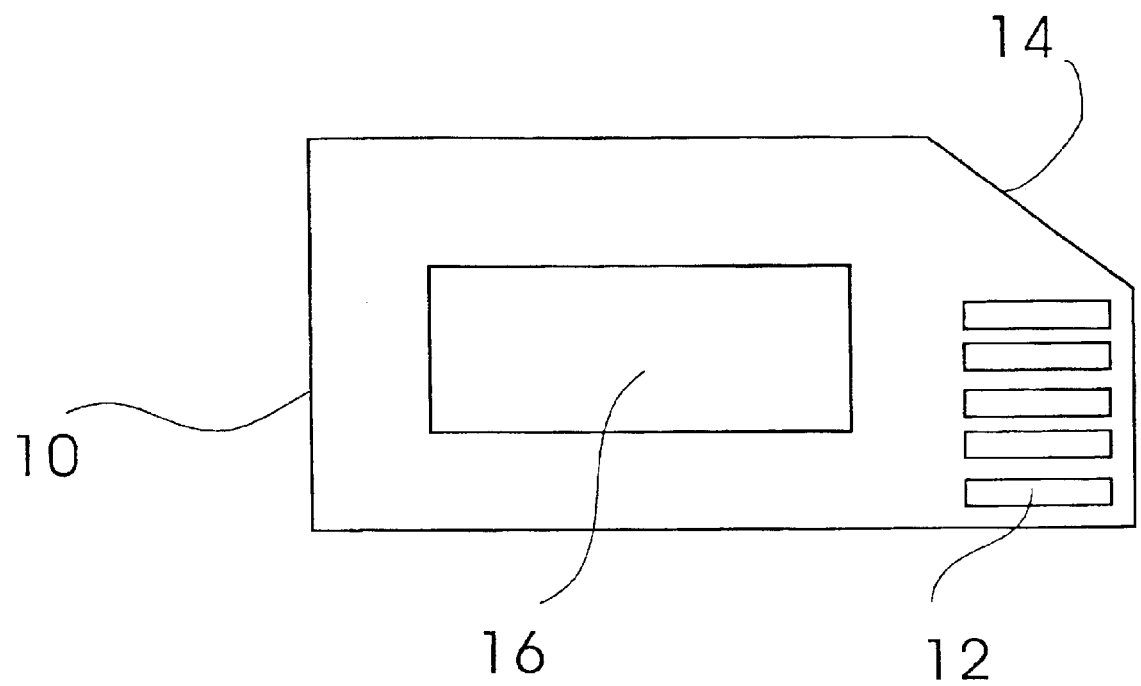
FIG. 1 is a schematic illustrates showing a conventional small memory card structure.
Figure 2:
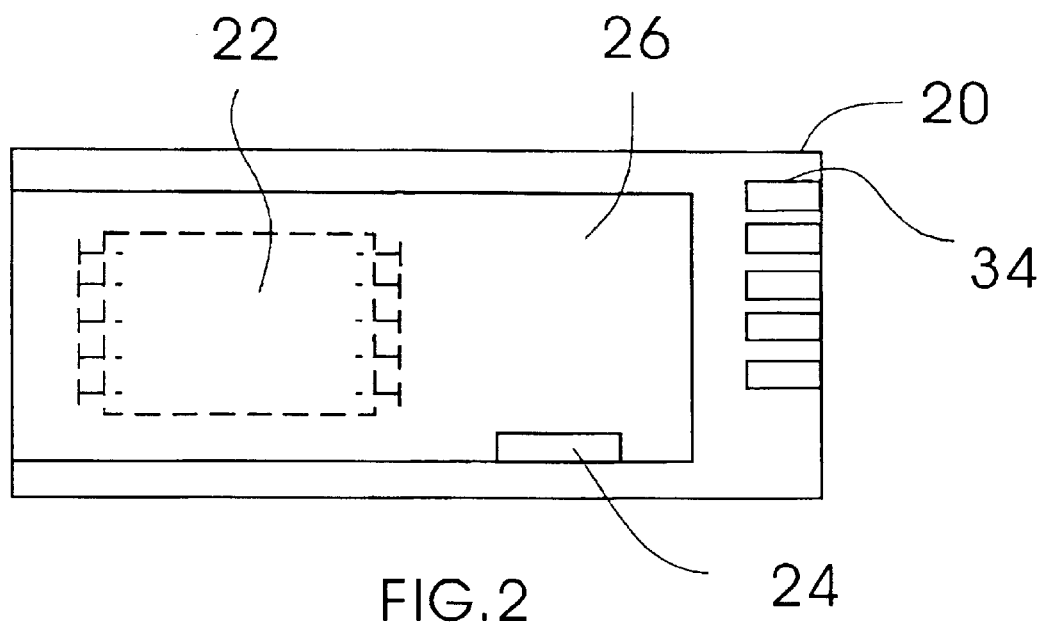
FIG. 2 is an up-side view showing a small memory card with monitor of the present invention.
Figure 3:
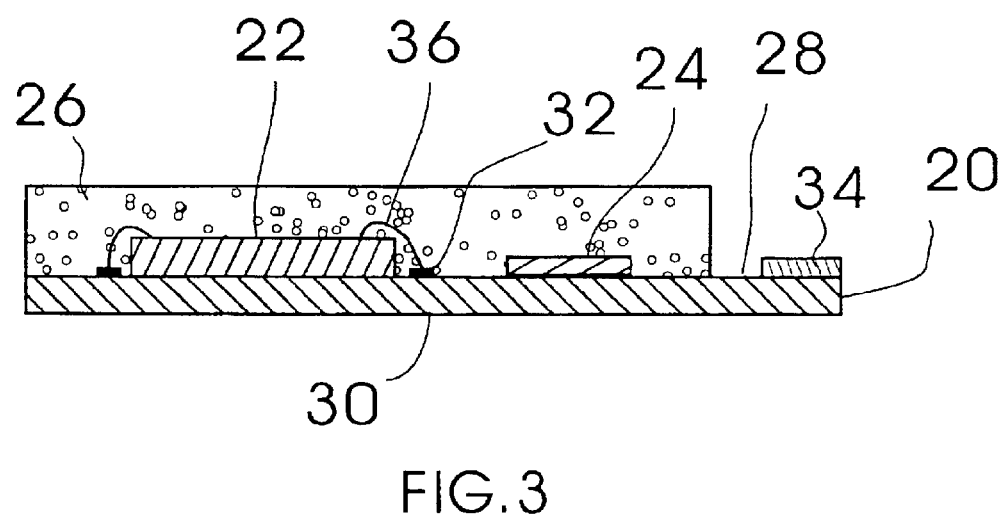
FIG. 3 is a cross-sectional view of FIG. 2.

FIG. 2 and FIG. 3 are showing an up side and cross-section views showing a small memory card with monitor of the present invention, which included a substrate 20, a memory chip 22, a monitor 24 and a glue layer 26.

The substrate 20 is formed with an upper surface 28 and a lower surface 30, the upper surface 28 that is formed with a plurality of connected points and a plurality of golden fingers 34, electrically connected to a plurality of connected points, the substrate 20 is used to set in an electric device, so that the plurality of golden fingers 34 may be electrically connected to the electric device.

The memory chip 22 that is mounted on the upper surface 28 of the substrate 20, electrically connected to a plurality of connected points 32 of the upper surface 28 of the substrate 20 by a plurality of wires 36.

The monitor 24, which is a LED mounted on the side of the upper surface 28 of the substrate 20, is used to recognize the aspect of the plurality of golden fingers.

The glue layer 26 may be transparent glue, the glue layer 26 is encapsulated the memory chip 22 and the monitor 24. And the monitor 24 is revealed besides the glue layer 26, so that the light of the monitor 24 will spread out and the location of the plurality of golden fingers will be recognized.

Figure 4:
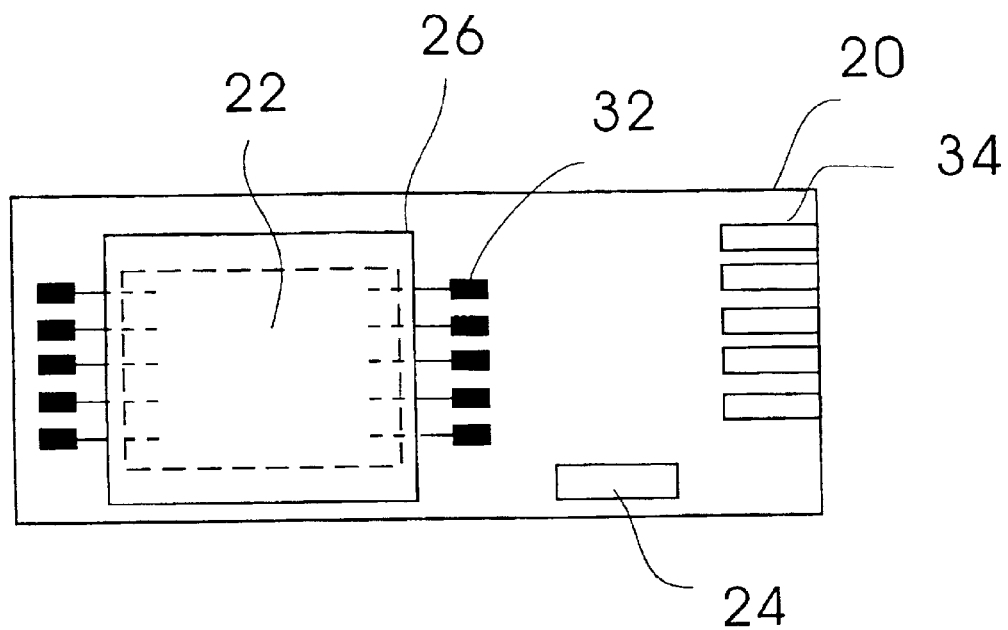
FIG. 4 is another up-side view of the present invention.
Figure 5:
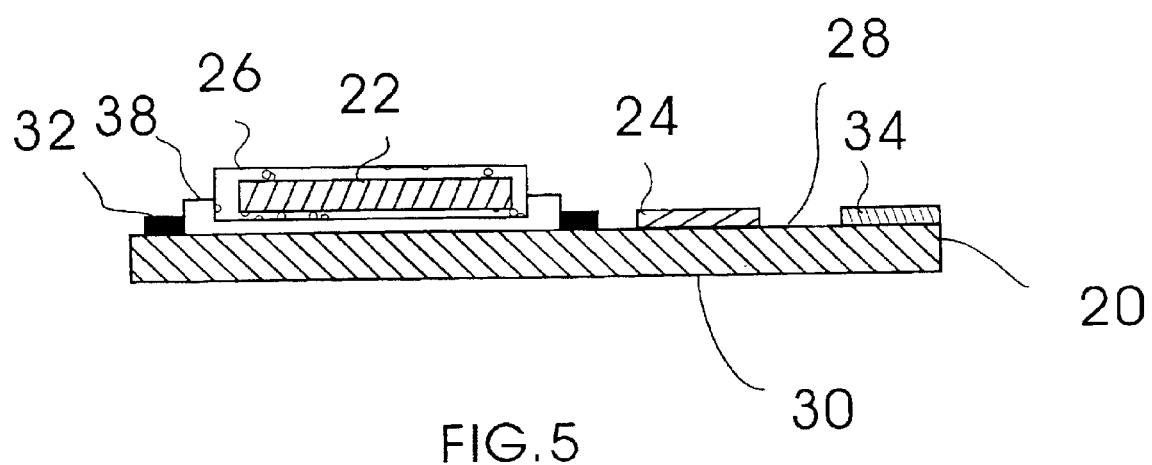
FIG. 5 is a cross-section view of FIG. 4.

Referring to FIG. 4 and FIG. 5 are schematics illustrate the small memory card with a monitor of the present invention, the memory card includes a substrate 20, a memory chip 22, a monitor 24 and a glue layer 26.

The substrate 20 is formed with an upper surface 28 and a lower surface 30, the upper surface 28, which is formed with a plurality of connected points 32 and a plurality of golden fingers 34, electrically connected to the plurality of connected points 32, the substrate 20 is used to arrange in an electric device, so that the plurality of golden fingers 34 of the upper surface of the substrate may be electrically connected to the electric device.

The glue layer 26 is encapsulated the memory chip 22 them mounted on the upper surface 28 of the substrate 20, the glue layer 26 is electrically connected to the plurality of connected points 32 of the substrate 20 by the plurality of pins 38.

The monitor 24, in the embodiment is a LED, which is mounted on the side of the upper surface 28 of the substrate 20, so that the aspect and location of the plurality of the golden fingers 34 may be recognized.

Thus, the small memory card is mounted a monitor 24 may be recognized the aspect and location of the golden fingers, so that the users may recognized the operating aspect conveniently.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A small memory card with a monitor to be set in an electric device, comprising:

A substrate having an upper surface and a lower surface, the upper surface formed with a plurality of connected points and a plurality of golden fingers electrically connected to the plurality of connected fingers, the substrate arranged in the electric device, so that the plurality of golden fingers may be electrically connected to the electric device; and At least one memory chip, which is arranged on the upper surface of the substrate, electrically connected to the plurality of connected points;

At least one monitor arranged on the side of the upper surface of the substrate, so that the aspect and location of the plurality of golden fingers may be recognized; and A glue layer 26 is encapsulated the memory chip and the monitor for protecting the memory chip and the monitor.

2. The small memory card with a monitor according to claim 1, wherein the monitor is LED, which is arranged on the side of the plurality of golden fingers of the substrate.

3. The small memory card with a monitor according to claim 1, wherein the glue layer is transparent.

4. The small memory card with a monitor according to claim 1, wherein the monitor revealed out of the glue layer.

5. The small memory card with a monitor according to claim 1, wherein the memory chip is electrically connected to the plurality of connected points of the substrate by a plurality of wires.

6. A small memory card with a monitor to be set in an electric device, comprising A substrate formed with an upper surface and a lower surface, the upper surface is formed with a plurality of connected points and a plurality of golden fingers electrically connected to a plurality of connected points, and the substrate is used to arrange in the electric device, so that the plurality of the golden fingers of the substrate may be electrically connected to the electric device;

At least one memory chip;

A glue layer 26 is encapsulated the memory chip for protecting the memory chip and the monitor; and At least one monitor, the monitor is arranged on the side of the upper surface of the substrate, so the aspect and location of the plurality of golden fingers may be recognized.

7. The small memory card with a monitor according to claim 6, wherein the monitor is LED, which is arranged on the side of the plurality of golden fingers of the upper surface of the substrate.

* * * * *